United States Patent [19]

Toukhy

[11] Patent Number: 4,587,196
[45] Date of Patent: * May 6, 1986

[54] POSITIVE PHOTORESIST WITH CRESOL-FORMALDEHYDE NOVOLAK RESIN AND PHOTOSENSITIVE NAPHTHOQUINONE DIAZIDE

[75] Inventor: Medhat A. Toukhy, Barrington, R.I.

[73] Assignee: Philip A. Hunt Chemical Corporation, W. Paterson, N.J.

[ * ] Notice: The portion of the term of this patent subsequent to Mar. 22, 2000 has been disclaimed.

[21] Appl. No.: 666,743

[22] Filed: Oct. 31, 1984

Related U.S. Application Data

[63] Continuation of Ser. No. 403,935, Aug. 2, 1982, Pat. No. 4,529,682, which is a continuation-in-part of Ser. No. 275,707, Jun. 22, 1981, abandoned.

[51] Int. Cl.⁴ ............................ G03C 1/60; G03C 1/54
[52] U.S. Cl. ...................................... 430/192; 430/165; 430/191; 430/311; 430/323; 430/326; 430/330
[58] Field of Search ............... 430/192, 165, 191, 326, 430/311, 323, 330

[56] References Cited

U.S. PATENT DOCUMENTS

| | | | |
|---|---|---|---|
| 3,046,120 | 7/1962 | Schmidt | 430/192 |
| 3,130,048 | 4/1964 | Fritz et al. | 430/192 |
| 3,647,443 | 3/1972 | Rauner et al. | 430/192 |
| 3,666,473 | 5/1972 | Colom et al. | 430/192 |
| 3,713,830 | 1/1973 | Watkinson | 430/176 |
| 4,173,470 | 11/1979 | Fahrenholtz et al. | 430/192 |
| 4,308,368 | 12/1981 | Kubo | 430/192 |
| 4,377,631 | 3/1983 | Toukhy et al. | 430/192 |
| 4,529,682 | 7/1985 | Toukhy | 430/192 |

FOREIGN PATENT DOCUMENTS

| | | | |
|---|---|---|---|
| 2616992 | 3/1977 | Fed. Rep. of Germany | 430/192 |
| 1227602 | 4/1971 | United Kingdom | 430/190 |
| 1154749 | 6/1979 | United Kingdom | 430/193 |

Primary Examiner—Charles L. Bowers, Jr.
Attorney, Agent, or Firm—Kirschstein, Kirschstein, Ottinger & Israel

[57] ABSTRACT

Cresol-formaldehyde novolak resins made from a mixture containing meta- and paracresol or ortho-, meta- and paracresol in a ratio selected from a given range for use in fast positive photoresist compositions together with one or more sensitizing compounds. When dissolved in a mixture of organic solvents, the photoresist compositions are suitable for application as a thin coating to a substrate. After the coating has been dried, the coated substrate can be exposed to image-wise modulated actinic radiation and developed in alkaline solution, yielding a relief pattern of resist on substrate useful for a number of applications.

9 Claims, 1 Drawing Figure

POSITIVE PHOTORESIST WITH CRESOL-FORMALDEHYDE NOVOLAK RESIN AND PHOTOSENSITIVE NAPHTHOQUINONE DIAZIDE

CROSS REFERENCE TO RELATED APPLICATION

This is a continuation of application Ser. No. 403,935, filed Aug. 2, 1982, now U.S. Pat. No. 4,529,682, which is a continuation-in-part of application Ser. No. 275,707, filed June 22, 1981, abandoned.

BACKGROUND OF THE INVENTION

The present invention relates generally to cresol-formaldehye novolak resins and particularly to such resins as used together with napthoquinone diazide sensitizing agents to form light-sensitive positive photoresist compositions.

Description of the Prior Art

Positive photoresist formulations such as are described in, for example, U.S. Pat. Nos. 3,666,473, 4,115,128 and 4,173,470, include alkali-soluble phenol-formaldehyd novolak resins together with light-sensitive materials, usually a substituted naphthoquinone diazide compound. The resins and sensitizers are dissolved in an organic solvent or mixture of solvents and are applied as a thin film or coating to a substrate suitable for the particular application desired.

The novolak resin component of these photoresist formulations is soluble in alkaline aqueous solution, but the naphthoquinone sensitizer acts as a dissolution rate inhibitor with respect to the resin. Upon exposure of selected areas of the coated substrate to actinic radiation, however, the sensitizer undergoes a radiation-induced structural transformation which decreases its efficiency as a dissolution rate inhibitor for the novolak and, subsequently, the exposed areas of the coating are rendered more soluble than the unexposed areas. This difference in solubility rates causes the exposed areas of the photoresist coating to be dissolved when the substrate is immersed in alkaline developing solution while the unexposed areas are largely unaffected, thus producing a positive relief pattern of photoresist on substrate.

In most instances, the exposed and developed substrate will be subjected to treatment by a substrate-etchant solution. The photoresist coating protects the coated areas of the substrate from the etchant and thus the etchant is only able to etch the uncoated areas of the substrate, which, in the case of a positive photoresist, correspond to the areas that were exposed to actinic radiation. Thus, an etched pattern can be created on the substrate which corresponds to the pattern of the mask, stencil, template, etc., that was used to create selective exposure patterns on the coated substrate prior to development.

The relief pattern of photoresist on substrate produced by the method described above is useful for various applications including, for example, as an exposure mask or a pattern such as is employed in the manufacture of miniaturized integrated electronic components.

The properties of a photoresist composition which are important in commercial practice and which are sought to be improved hereby include the photospeed of the resist, the development contrast thereof, the resist resolution, and the resist adhesion.

For the purposes of this specification, resist photospeed is defined as the minimum exposure time, assuming constant light intensity, required to render an exposed area of a dried resist coating of a given thickness on a substrate completely soluble to a developing solution. Increased photospeed is important for a photoresist, particularly in applications where a number of exposures are needed, for example, in generating multiple patterns by a repeated process, or where light of reduced intensity is employed such as, for example, in projection exposure techniques where the light is passed through a series of lenses and monochromatic filters. Thus, increased photospeed is particularly important for a resist composition employed in processes where a number of multiple exposures must be made to produce a mask or series of circuit patterns on a substrate. In measuring resist photospeed, optimum development conditions are utilized. These optimum conditions include a constant development temperature and time in a particular development mode, and a developer system selected to provide complete development of exposed resist areas while maintaining a maximum unexposed resist film thickness loss not exceeding 10 percent of initial thickness.

Development contrast, as used herein, refers to a comparison between the percentage of film loss in the exposed area of development with the precentage of film loss in the unexposed area. Ordinarily, development of an exposed resist coated substrate is continued until the coating on the exposed area is completely dissolved away and thus, development contrast can be determined simply by measuring the percentage of the film coating loss in the unexposed areas when the exposed coating areas are removed entirely. By definition, development contrast is always within an acceptable range under optimum development conditions because these conditions are selected to provide no more than 10 percent loss of film thickness in the unexposed areas, while the coating or film in the exposed areas is completely removed.

Resist resolution is defined as the capability of a resist system to reproduce the smallest equally spaced line pairs and intervening spaces of a mask which is utilized during exposure with a high degree of image edge acuity in the developed exposed spaces. Quantitatively, resist resolution can be measured by calculating, after development, the ratio of the width of the unexposed area corresponding to a line on the mask to the width of the exposed area corresponding to the adjacent space and comparing that ratio to the ratio of line and space widths on the mask itself. Ideally, the ratio of the widths on the developed resist-coated substrate should equal the ratio of the widths of the mask. In many industrial applications, particularly in the manufacture of miniaturized electronic components, a photoresist is required to provide a high degree of resolution for very small line and space widths (on the order of one micron).

Various attempts have been made in the prior art to improve the photospeed of positive photoresist compositions by using selected novolak resin formulations with or without additional components. For example, in U.S. Pat. No. 3,666,473, a mixture of two phenol-formaldehyde novolak resins were utilized together with a typical sensitizer, said novolak resins being defined by their solubility rates in alkaline solutions of a particular pH and by their cloud points. In U.S. Pat. No.

4,115,128, a third component consisting of an organic acid cyclic anhydride was added to the phenolic resin and naphthoquinone diazide sensitizer to provide increased photospeed. These prior art compositions, however, while providing somewhat improved photospeed, involve the use of additional components or overly complex control of reaction conditions and detailed analysis of the components utilized, in comparison with compositions utilizing simply a single phenolic resin together with a simple sensitizer.

Another prior art photoresist composition, which has been commercially available, contains a novolak resins formed from a mixture of ortho-, meta-, and paracresols and subsequently chemically reacted with a particular naphthoquinone diazide sensitizer to produce a sensitized novolak; e.g., a novolak chemically bonded to a sensitizer. This prior art material while possessing good resolution properties, does not have particularly rapid photospeed, which is a significant drawback in many industrial applications such as the large scale production of miniaturized integrated circuit components.

West German Pat. No. 26-16-992, issued to Agfa-Gevaert A.G., discloses positive resist formulations containing novolaks produced from a mixture of 50% meta/50% paracresol condensed with formaldehyde. These novolak resins are disclosed in the West German patent as being intended for the preparation of photo-lacquers for the production of print forms and etch-resistant articles, and are said to be advantageous for their good stability in alkali treatment baths and high elasticity. But because of their method of production, which involves a two-step condensation under highly reactive conditions, the Agfa-Gevaert novolaks are highly polymerized, heavy and viscous and have high softening points and produce resist compositions with poor photospeed and resolution capabilities. These novolak resins are not at all suitable for use in microelectronic applications where fast, high-resolution resists are essential in order to efficiently and economically manufacture high-density electronic circuitry components.

SUMMARY OF THE INVENTION

1. Objects of the Invention

Another object of the present invention is to provide novel cresol-formaldehyde novolak resins to be used primarily to produce positive photoresist compositions which have increased photospeed in comparison with similar prior art compositions.

It is an object of the present invention to provide novel cresol-formaldehyde novolak resins produced from cresols mixed in porportions selected from a given range.

A further object of the present invention is to provide a photoresist coating, suitable for application to a substrate, utilizing the fast photoresist compositions produced from the novel novolaks.

Still another object of the present invention is to provide fast photoresist compositions comprising a cresol-novolak resin chemically bonded to a selected naphthoquinone diazide sensitizer.

Still another object of the present invention is to provide novolak resins which can be used to produce fast photoresist compositions which provide particularly good development contrast and resolution when exposed to actinic radiation with a wavelength of from about 315 to 450 nanometers.

Yet another object of the present invention is to provide novolak resins which can be used to produce fast photoresist compositions particularly suited for use in the production of miniaturized electronic components.

2. Brief Description of the Invention

In keeping with these objects and others which will become apparent hereinafter, the present invention resides, briefly stated, in a cresol-formaldehyde novolak resin produced from a mixture of meta- and para-cresol or from a mixture of ortho-, meta-, and paracresol, said cresols being present by weight in the mixture in proportions chosen from a selected range. The novolaks of the present invention all have softening points between 110° and 145°.

A light-sensitive photoresist coating suitable for application to a substrate, exposure to actinic radiation and subsequent development in alkaline solution can be produced by dissolving the photoresist compositions made with the novolaks of the present invention in an appropriate organic solvent or mixture of organic solvents.

The resist compositions made with the novolaks of the present invention and the photosensitive coatings made therefrom display excellent photospeed while achieving a high degree of resolution and good development contrast. The compositions are particularly sensitive to radiation in the near-ultraviolet to conventional ultraviolet range; i.e., radiation from a wavelength of from 315 to 450 nanometers.

The sensitizers which comprise a component of the improved resist compositions, together with the novolaks of the present invention, are selected from the group of substituted naphthoquinone diazide sensitizers which are conventionally used in the art in positive photoresist formulations. Such sensitizing compounds are disclosed, for example, in U.S. Pat. Nos. 2,797,213; 3,106,465; 3,148,983; 3,130,047; 3,201,329; 3,785,825; 3,802,885.

Alternatively, in accordance with the present invention, the novel novlak resins may be chemically reacted with a naphthoquinone diazide sensitizer to form a sensitized resin, which, when dissolved in suitable solvents, provides a light-sensitive photoresist coating without requiring the addition of any other separate sensitizing component.

The novelty of the novolak resins of the present invention resides in the use of specific mixtures of cresol isomers, wherein the proportions of the individual cresol isomers within the mixture are chosen from a particular range, to produce these resins under a specified range of reaction conditions. Photoresist compositions which include novolak resins produced by condensing these selected cresol mixtures with formaldehyde have been found to be considerably faster in development than similar novolak-containing resists, whether a sensitizing compound is added to the novolak as a separate component to produce the resist or whether the novolak is chemically bonded to a sensitizer.

The novolak resins which are produced according to the present invention have softening points between 110° and 145° C. For a given composition of cresols, the softening point of the novolak is correlated with its average molecular weight; i.e., novolaks with a higher average molecular weight have a higher softening point, and those with a lower average molecular weight have a lower softening point. The average molecular weight is in turn a function of the number of cresol units that become linked by methylene bridges as a result of the reaction with formaldehyde to form the resin molecules.

It is normally possible to raise the molecular weight and hence the softening point of the novolak by increasing the ratio of formaldehyde to cresols employed in the reaction, because the larger quantity of formaldehyde in the reaction mixture will cause a greater degree of linkage of the cresol units and hence larger resin molecules.

As a correlative of their relatively low softening points, the novolaks of the present invention have relatively low average molecular weights and viscosities, particularly in comparison with certain prior art novolaks also made from mixtures of cresol isomers but under more vigorous reaction conditions. The lower softening points, molecular weights and viscosities of the novolaks of the present invention contribute significantly to their dramatically improved photospeed, adhesion and resolution properties as compared with prior art mixed cresol novolaks.

Photoresist compositions made with the novolaks of the present invention, in addition to exhibiting increased photospeed in comparison with prior art positive photoresists, exhibit a high degree of resolution and good development contrast and adhesion properties. These properties are in marked contrast to compositions containing some prior art resins which achieve moderately increased photospeed while at the same time sacrificing resolution and contrast.

DETAILED DESCRIPTION OF THE INVENTION

A. Production of the Novolak Resins

Figure 1:
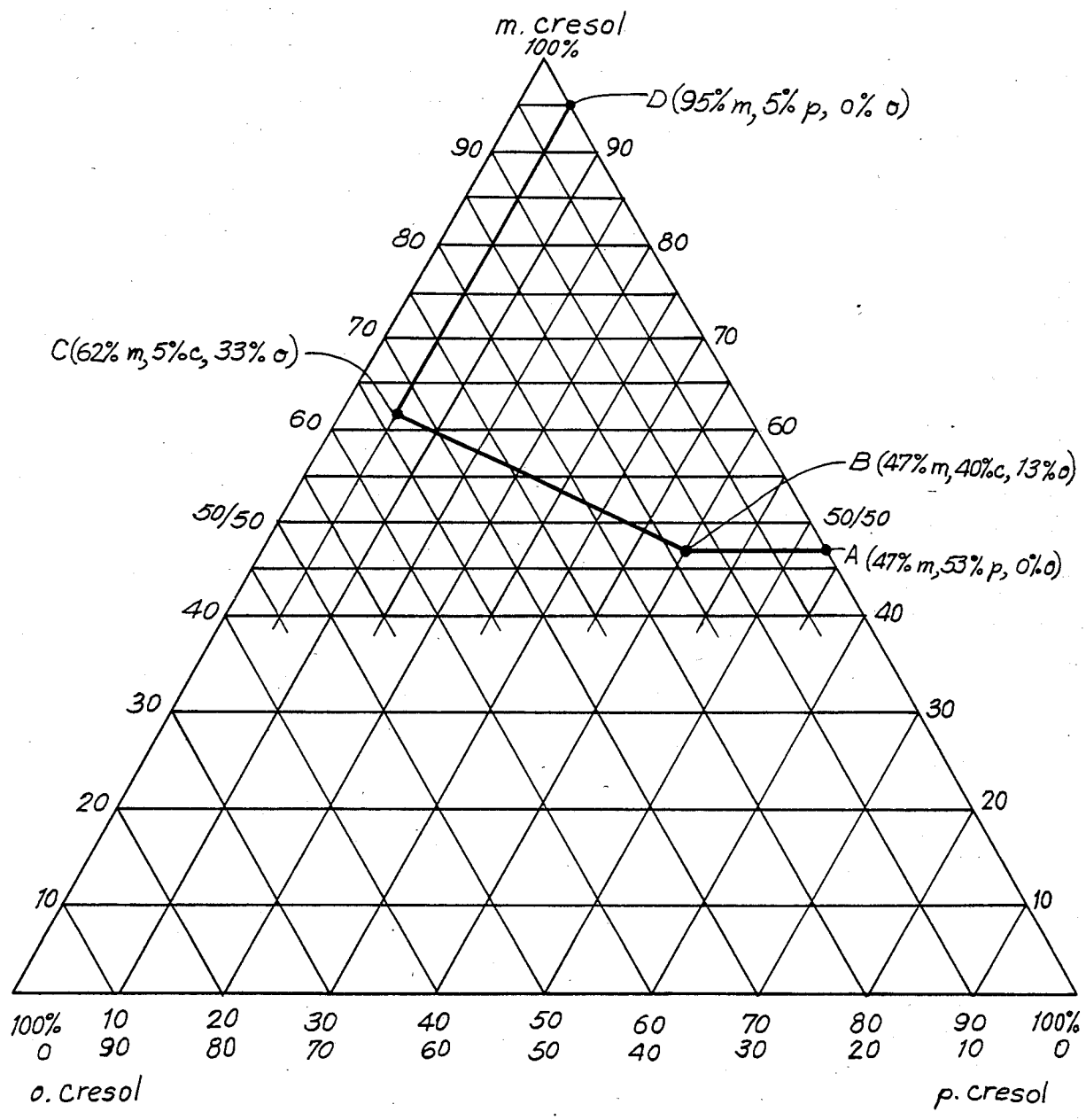
FIG. 1 is a three-variable graph with axes meeting at 60° angles with respect to one another, each points on said graph determining the respective percentages by weight of ortho-, meta-and paracresol in a mixture of cresol isomers, and the quadrilateral ABCD drawn on said graph by connecting points A, B, C and D with straight lines defining the range of proportions of cresol isomers in the cresol mixtures used in the present invention.

The novolak resins of the present invention are produced by condensation with formaldehyde of a mixture of meta- and paracresol or ortho-, meta-, and paracresol, with the various cresol isomers present by weight in the mixture in proportions selected from the area bounded by quadrilateral ABCD shown on the three-variable graph of FIG. 1.

The values of points A, B, C and D which define the corners of the quadrilateral in FIG. 1 are as follows:

|       | cresol isomers |      |       |
| Point | meta | para | ortho |
| --- | --- | --- | --- |
| A | 47% | 53% | 0% |
| B | 47% | 40% | 13% |
| C | 62% | 5% | 33% |
| D | 95% | 5% | 0% |

The points which lie on the boundary lines AB, BC, CD, and DA of quadrilateral-ABCD are included within the present invention as well.

To prepare the novolak resins, an amount of each cresol isomer appropriate to provide a mixture in which the proportions by weight of the isomers fall within the area ABCD shown in FIG. 1 is charged into a reaction vessel. A less than equivalent (in stoichiometric terms) quantity of an approximately 37% aqueous formaldehyde solution is then added to the cresols in the presence of an acid; for example, a small quantity of oxalic acid. The reaction must be conducted in an acidic medium in order to ensure that a novolak-type resin is formed; i.e., one which has methylene bridges between the phenolic nuclei as shown in the following diagram as a typical example:

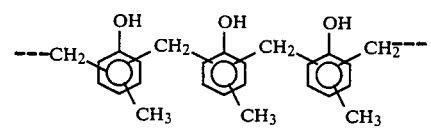

If the condensation of the cresols with formaldehyde is conducted in an alkaline medium, resins known as resoles will be formed. Resole-type resin compositions are not within the scope of the present invention.

It is also necessary in synthesizing the novolak resins that the amount of formaldehyde charged into the reaction vessel be less than a stoichiometrically equivalent quantity in comparison with the quantity of cresols charged in order to produce a fusible, soluble resin. If an excess of formaldehyde is charged, the resin formed will in most cases be insoluble and totally unsuitable for the preparation of photoresist compositions.

The reaction mixture, comprising the charged cresols, aqueous formaldehyde solution, and acid is first heated to reflux gently at about 100° C. If a violent exothermic reaction ensues, the reaction mixture is cooled by immersing the flask in a water bath for the duration of the exotherm.

The gentle reflux is allowed to proceed for approximately 12 to 24 hours depending on the reactivity of the cresols charged and the formaldehyde-cresol ratio in the mixture. The metacresol is generally more reactive than the other cresol isomers and, therefore, if the cresol mixture is predominantly meta-, a shorter reflux time will be required to complete the reaction. In addition, the greater the ratio of formaldehyde to cresols (up to a maximum of a molar ratio of formaldehyde to cresols of about 0.9:1), the more quickly the reaction will proceed.

At the end of the reaction, water is distilled off, first at atmospheric pressure and then at a pressure of about 30 to 50 millimeters of mercury until the temperature of the reaction mixture reaches approximately 225° C., at which point the vacuum, which is applied by means of a vacuum pump, is increased to near-total levels at a temperature of about 230° C. to distill off unreacted cresol monomers.

After distillation, the resultant liquefied novolak is poured into a cooling tray in an atmosphere of nitrogen to avoid oxidation and solidifies upon cooling the room temperature to a brittle mass. The novolaks of the present invention, prepared in accordance with the procedure described above, all have a softening point in the range of 110°-145° C.

B. Production of Photoresist Compositions Comprising a Novolak Resin and a Sensitizer as an Unreacted Component To produce photoresist compositions with a novolak and a sensitizer as unreacted components, the brittle novolak resin is fragmented with, for example, a mortar and pestle, and added to a mixture of suitable organic solvents, particularly ethyl Cellosolve acetate, butyl acetate and xylene in an amber-colored bottle. A quantity of a naphthoquinone diazide sensitizing compound or a combination or blend of such sensitizers is then added to and dissolved in the solution containing the novolak. The proportions by weight of the novolak and sensitizer in the solution which are dissolved in the solvent mixture are such that the novolak resin comprises 50 to 95 percent by weight of the total weight of resin and sensitizer while the sensitizer comprises 5 to 50 percent by weight of the total weight of resin and sensitizer.

The naphthoquinone diazide sensitizing compounds used in producing photoresist compositions with the novolaks of the present invention would generally be esters of one of the following naphthoquinone diazide sulfonyl chloride sensitizers:

Compound I

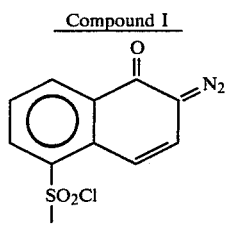

Compound II

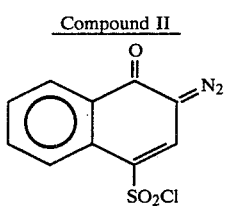

The sensitizers used in the photoresist compositions which comprise a novolak and a sensitizer as unreacted components can be mono-, di- or tri-esterified with Compound I or Compound II, and are exemplified by the following formulas:

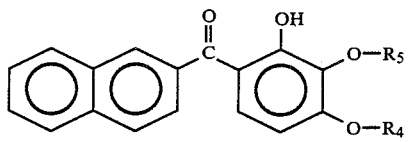

Formula 1

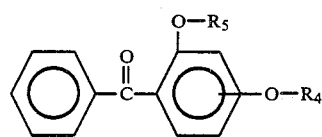

Formula 2

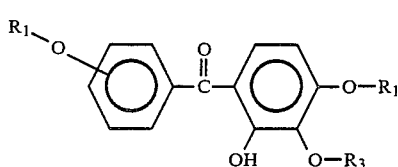

Formula 3

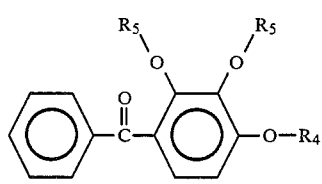

Formula 4

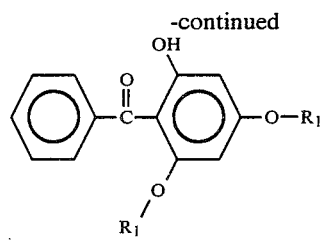

Formula 5

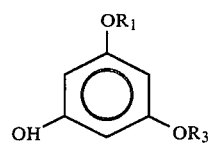

Formula 6

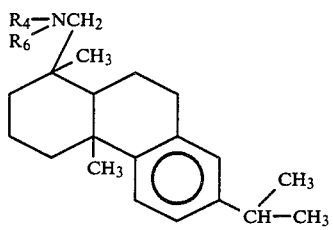

Formula 7

$R_1-O-(CH_2)_2-O-C_2H_5$

Formula 8 wherein $R_1$ is

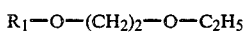

$R_2$ is

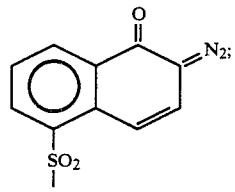

$R_3$ is $R_1$ or H; $R_4$ is $R_1$ or $R_2$, but *cannot* be both $R_1$ and $R_2$ in the same molecule; $R_5$ is $R_4$ or H; and $R_6$ is $C_2H_5$, $C_2H_4OH$ or H.

After the resin (unsensitized) and sensitizer have been added to the solvents, the bottle is agitated until all solids are dissolved, which usually takes about 12 hours. The resultant photoresist solution is microfiltered using a millipore microfiltration system under approximately 30 pounds per square inch of pressure of nitrogen or other inert, oxygen-lacking ambient atmosphere.

Additives such as dyes, anti-striation agents, plasticizers, adhesion promoters, speed enhancers, and nonionic surfactants may be added to the solution of novolak resin and sensitizer before the solution is coated onto a substrate.

Exemplificative dye additives that may be used together with the photoresist compositions of the present invention include Methyl Violet 2B (C.I. No. 42535), Crystal Violet (C.I. No. 42555), Malachite Green (C.I. No. 42000), Victoria Blue B (C.I. No. 44045) and Neutral Red (C.I. No. 50040) at one to ten percent weight levels, based on the combined weight of novolak and sensitizer. The dye additives help provide increased resolution by inhibiting back scattering of light off the substrate.

Anti-striation agents may be used up to a five percent weight level, based on the combined weight of novolak and sensitizer.

Plasticizers which may be used include, for example, Phosphoric acid tri-($\beta$-chloroethyl)-ester; stearic acid; dl-camphor; polypropylene; acetal resins; phenoxy resins; and alkyl resins at one to ten percent weight levels, based on the combined weight of novolak and sensitizer. The plasticizer additives improve the coating properties of the material and enable the application of a film that is smooth and of uniform thickness to the substrate.

Adhesion promoters which may be used include, for example, $\beta$-(3,4-epoxy-cyclohexyl)-ethyltrichlorosilane; p-methyldisilane-methyl methacrylate; vinyltrimethoxysilane; and $\gamma$-aminopropyl triethoxysilane up to a 5 percent weight level, based on the combined weight of novolak and sensitizer.

Speed enhancers that may be used include, for example, picric acid, nicotinic acid or nitrocinnamic acid at a weight level of up to 20 percent, based on the combined weight of novolak and sensitizer. These enhancers tend to increase the solubility of the photoresist coating in both the exposed and unexposed areas, and thus they are used in applications where speed of development is the overriding consideration even through some degree of contrast may be sacrificed; i.e., while the exposed areas of the photoresist coating will be dissolved more quickly by the developer, the speed enhancers will also cause a larger loss of photoresist coating from the unexposed areas.

Non-ionic surfactants that may be used include, for example, nonylphenoxy poly(ethyleneoxy) ethanol; octylphenoxy (ethyleneoxy) ethanol; and dinonyl phenoxy poly (ethyleneoxy) ethanol: at up to 10 percent weight levels, based on the combined weight of novolak and sensitizer.

C. Production of a Photoresist Composition Comprising a Sensitized Novolak Resin To provide a photoresist comprising a sensitized novolak a quantity of brittle novolak resin produced according to the present invention is fragmented, such as with a mortar and pestle, and dissolved in a suitable organic solvent such as dioxane, in an Erlenmeyer flask. A quantity of a naphthoquinone diazide sensitizer or a combination of sensitizers, comprising by weight approximately 12 to 18 percent of the total weight of sensitizer and novolak, is added to and dissolved in dioxane in a second Erlenmeyer flask. A 3 to 10 percent aqueous solution of sodium hydroxide is prepared in a third flask.

The sensitizers utilized in producing sensitized novolaks are exemplified by the following compounds:

Compound I

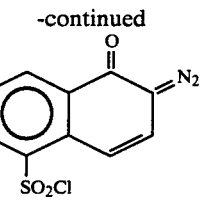

-continued

Compound II

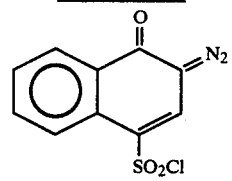

The chemical name of Compound I is naphthoquinone-(1,2)-diazide-5-sulfonyl chloride, and the chemical name of Compound II is naphthoquinone-(1,2)-diazide-4-sulfonyl chloride.

The novolak solution and the sensitizer solution are added to a large Erlenmeyer flask equipped with a stirrer and immersed in an ice bath cooling solution. The sodium hydroxide solution is then gradually added to the flask containing the resin and sensitizer over a period of several hours and the reaction mixture is stirred continuously. After the addition of the entire sodium hydroxide solution, the reaction mixture is poured into a larger vessel and neutralized with a dilute aqueous solution of hydrochloric acid under agitation, causing the precipitation of a rubbery tacky solid. The solution in the vessel is then stirred for approximately one hour and filtered.

The tacky precipitate is subsequently dried for approximately 12 to 18 hours in a vacuum oven at a pressure of approximately 0.5 to 1 millimeters of mercury and at a temperature of 40° to 50° C. After drying, the sensitized novolak product has the form of a spongy solid which can easily be crushed into a coarse powder.

The degree of sensitization of the sensitized novolak produced according to the procedure described is defined as the percentage of cresol nuclei in the resin which become bonded to a sensitizer radical. The optimum degree of sensitization for the purpose of the photoresist compositions of the present invention has been found to be in the range of 4 to 25 percent. Thus, the sensitized novolaks of the present invention have the following general structural formula:

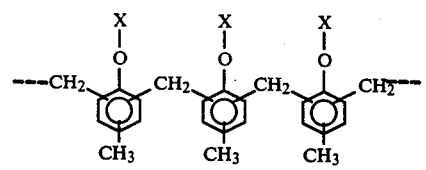

wherein X may be a sensitizer radical previously designated as $R_1$ or $R_2$ or hydrogen, but only 4 to 25 percent of the groups labeled X will be sensitizer units.

The sensitized novolak is dissolved in a mixture of organic solvents in the same manner as has been previously described in connection with the resist compositions comprising a resin and a sensitizer as separate components, and the additives listed previously may be utilized in connection with the sensitized novolak composition as well.

D. Preparation of Resist-Coated Substrates

The filtered resist solution, whether containing a sensitized novolak or a novolak and sensitizer as separate unreacted components, can be applied to a substrate by any conventional method used in the photoresist art, including dipping, spraying, whirling and spin coating. When spin coating, for example, the resist solution can be adjusted as to the percentage of solids content in order to provide coatings of the desired thickness given the type of spinning equipment utilized and the amount of time allowed for the spinning process.

The photoresist coatings produced by the above-described procedure are particularly suitable for application to thermally grown silicon/silicon dioxide-coated wafers such as are utilized in the production of microprocessors and other miniaturized integrated circuit components. An aluminum/aluminum oxide wafer can be used as well.

After the resist composition solution is coated onto the substrate, the substrate is baked at approximately 100° to 105° C. until substantially all the solvent has evaporated and only a thin coating of photoresist composition on the order of a micron in thickness remains on the substrate. The coated substrate can then be exposed to actinic radiation in any desired exposure pattern, produced by use of suitable masks, negatives, stencils, templates, etc.

The exposed resist-coated substrates are next substantially immersed in alkaline developing solution in, for example, a Teflon tank. The solution is preferably agitated, for example, by nitrogen burst agitation. The substrates are allowed to remain in the developer until all, or substantially all, of the resist coating has dissolved from the exposed areas.

After removal of the coated wafers from the developing solution, a post-development heat treatment or bake may be employed to increase the coating's adhesion and chemical resistance to etching solutions and other substances. The post-development heat treatment can comprise the oven baking of the coating and substrate below the coating's softening point. In industrial applications, particularly in the manufacture of microcircuitry units on silicon/silicon dioxide-type substrates, the developed substrates will be treated with a buffered, hydrofluoric acid-based etching solution. The resist compositions made with novolaks of the present invention are resistant to acid-based etching solutions and provide effective protection for the unexposed resist-coated areas of the substrate.

The photoresist compositions made with the novolak resins of the present invention, whether comprising a novolak and a sensitizer as separate components or a novolak chemically bonded to a sensitizer, are superior to the prior art positive photoresist compositions made with novolaks produced from individual cresol isomers, or from mixtures of isomers in which the proportions of cresols lie outside the area of quadrilateral ABCD shown in FIG. 1 when compared under optimum conditions. The resist compositons made with novolaks of the present invention have significantly higher photospeed than other cresol-novolak resists and yet provide images with excellent resolution.

The subject resist compositions are particularly suitable for exposure to actinic radiation in the near-ultraviolet to conventional ultraviolet range; i.e., radiation with wavelengths of approximately 315 to 450 nanometers. This is due to the absorption profile of the naphthoquinone diazide sulfonate structures which are a component of these resist compositions. These naphthoquinone diazide sensitizers have absorption peaks and are thus most photochemically active at wavelengths of about 350 to 420 nanometers, and thus the resist compositions of the instant invention provide the best photospeed and resolution when exposed to radiation with wavelengths in the region of those absorption peaks.

After the following examples, data are given illustrating the superiority of the photoresists made with novolaks of the present invention, particularly with regard to improved photospeed, in comparison with related prior art compositions. In all instances where such comparative data are give, the resist coated substrates used were developed under optimum development conditions. These conditions include a one-minute exposure time, a constant development temperature of 22° C., optimum developer systems, and use of a nitrogen agitation immersion development mode. The developer systems were selected so as to provide complete development of the exposed resist area while obtaining a maximum unexposed resist film thickness loss not exceeding 10 percent of initial thickness.

The following specific examples will provide detailed illustrations of the methods of producing and utilizing compositions of the present invention. These examples are not intended, however, to limit or restrict the scope of the invention in any way and should not be construed as providing conditions, parameters or values which must be utilized exclusively in order to practice the present invention.

EXAMPLE 1

Novolak Resin from m- and p-Cresols 272.5 g. of 98 percent pure m-cresol and 272.5 g. of p-cresol were mixed in a 1,000 ml. four-neck resin flask equipped wtih a stirrer, heating capacity and a reflux condenser. The proportions by weight of the cresols in the mixture were approximately 50 percent m-cresol and 50 percent p-cresol. 239.3 g. of 37.7 percent aqueous solution of formaldehyde was added to the cresol mixture together with 7.26 g. of oxalic acid dihydrate in a 60 ml. aqueous solution, and the reaction mixture was then heated to reflux gently at about 100° C. An exothermic condensation reaction ensued and a haze was formed which increased rapidly. The flask was then partially immersed in a water bath in order to cool the reaction mixture. The condensation reaction was allowed to continue for approximately 18 hours at reflux temperature. Heat was applied and distillation at atmospheric pressure under a constant flow of nitrogen commenced. When the temperature of the reaction mixture reached approximately 220° to 225° C., a partial vacuum pressure of 30 to 50 mm. of mercury was applied with a Welch Duo-Seal vacuum pump and was gradually increased until a maximum vacuum of about 0.2 mm. of mercury was reached when the mixture was at approximately 230° C. The mixture was then heated further and distilled for approximately an additional one hour with the distillates being collected in a round-bottomed flask. About 278.5 g. of aqueous distillate was obtained from the atmospheric pressure phase of the distillation. About 186 g. of vacuum distillate was obtained.

At the end of the distillation, the liquefied novolak resin remaining in the flask was poured into a cooling tray in an atmosphere of nitrogen. The product solidified upon cooling to room temperature. Approximately 377 g. of novolak resin was obtained having a softening point of 138° to 139° C.

EXAMPLE 2

Novolak Resin from o-, m- and p-Cresols 339.89 g. of m-cresol, 96.54 g. of p-cresol, and 48.27 g. of o-cresol were mixed in a flask as described in Example 1. The proportions by weight of cresols in the mixture were approximately 70 percent meta, 20 percent para, and 10 percent ortho. 271.5 g. of 37.7 percent aqueous solution of formaldehyde was then added to the cresol mixture together with about 6 g. of oxalic acid and the procedure of Example 1 was then followed to complete the synthesis.

This procedure yielded approximately 438.2 g. of novolak resin having a softening point of about 143° C.

EXAMPLE 3

Low Softening Point Novolak Resin from o-, m-, and p-Cresols 241.35 g. of m-cresol, 181.1 g. of p-cresol and 60.33 g. of o-cresol were mixed in a flask as described in Example 1. The proportions by weight of cresols in the mixture were approximately 50 percent meta-, 37.5 percent para- and 12.5 percent ortho-. 271.52 g. of 37.7 percent aqueous formaldehyde solution was added to the cresol mixture with about 6 g. of oxalic acid and the procedure of Example 1 was then followed to complete the synthesis.

The procedure yielded approximately 453 g. of novolak resin having a softening point of about 119.2° C.

EXAMPLE 4

Preparation of a Photoresist Composition

Into an amber-colored 200 ml. cylindrical bottle were weighed 5.7 g. of a sensitizer prepared by reacting 2, 3, 4-trihydroxybenzophenone with naphthoquinone-(1,2)-diazide-5-sulfonyl chloride in a 1:2 molar ratio. The sensitizer resulting from this reaction is a mixture of mono-, di-, and tri-esterified trihydroxybenzophenone. 22.4 g. of the novolak resin produced according to Example 2 and 72 g. of solvent mixture are added to the bottle as well. The solvent mixture comprised 85 percent ethyl Cellosolve acetate, 10 percent butyl acetate and 5 percent xylene. The bottle was then rolled on a high-speed roller for approximately 12 hours at room temperature until all solids were dissolved. The resulting resist solution was subsequently filtered through a 0.2 micron pore-size filter using a millipore microfiltration system (a 100 ml. barrel and a 47 mm. disk were used). The filtration was conducted in a nitrogen environment under a pressure of 30 pounds per square inch. Approximately 100 g. of resist solution was obtained having a viscosity of about 23 c.p.s.

EXAMPLE 5

Preparation of a Chemically Sensitized Novolak 5 g. of the novolak resin of Example 1 was dissolved in 165 g. of dioxane in an Erlenmeyer flask. In a separate flask 2 g. of naphthoquinone (1,2)-diazide-5-sulfonyl chloride (38 percent assay) was dissolved in 35 g. of dioxane. In a third flask, 1.8 g. of sodium hydroxide was dissolved in 43.2 g. of water to provide a four percent aqueous sodium hydroxide solution. The first and second solutions containing the novolak and the sensitizer were added to a 500 ml. Erlenmeyer flask equipped with a stirrer and immersed in an ice bath cooling solution. The aqueous sodium hydroxide solution was then added gradually to the flask over a three-hour period. The reaction mixture was then decanted into a 5,000 ml. flask and was neutralized with 3,000 ml. of dilute aqueous hydrochloric acid solution under agitation, causing the precipitation of the sensitized novolak as a rubbery, tacky solid. After stirring about one hour, the product was filtered and dried in a vacuum oven at a pressure of approximately 0.5 to 1 millimeters of mercury and at a temperature of 40° to 50° C. for 18 hours, and about 4.9 g. of sensitized novolak resin was obtained.

EXAMPLE 6

Coating of a Photoresist Composition onto a Substrate 100 g. of the resist composition of Example 4 was spin-coated with a spinner manufactured by Headway Research Inc. (Garland, Texas) onto a thermally grown silicon/silicon dioxide-coated wafer of two inches in diameter and 5,000 Å of oxide in thickness. A uniform coating, after drying, of one micron of film was obtained at a spinning velocity of 5,000 revolutions per minute for 30 seconds. The coated wafers were subsequently baked in an air-circulating oven at 100° to 105° C. for 30 minutes and the film thickness was then measured with a Sloan Dektak surface profilometer unit.

EXAMPLE 7

Exposure of Coated Substrate

Kaspar contact-exposure units with an intensity at the wafer surface of 9.1 milliwatts/cm$^2$ at 400 nanometers wave length were used to provide conventional ultraviolet exposure of the coated wafers of Example 6. Exposure times were varied in order to determine the photospeed of the resist, i.e., the minimum amount of exposure time which will solubilize the exposed areas of the resist so that the coating in the exposed areas will be completely removed during development.

EXAMPLE 8

Development of Exposed Resist-Coated Substrates

The resist-coated wafers produced and exposed according to Examples 6 and 7 were placed on circular Teflon wafer boats and immersed in two-liter Teflon containers containing Waycoat Positive LSI Developer Solution, Type I or Type II (Philip A. Hunt Chemical Corp.), an aqueous Alkaline buffered solution, with a pH of about 12.5. Nitrogen-burst agitation was provided in the Teflon container to aid and accelerate development. The wafers were allowed to remain immersed in the developer solution for one minute. Upon removal, the wafers were rinsed in water and baked in an air-circulating oven at about 125° C. to increase the adhesion and chemical resistance of the undissolved coating.

The following data relating to the photospeed of various resist compositions was generated using coating, exposure and development methods comparable to those described in the preceding examples for all resists tested. Moreover, all resist compositions were coated onto identical thermally grown silicon/silicon dioxide-coated wafers, were exposed to the same source of radiation, and were developed under the same conditions in the optimized developer systems. The photospeed values are indicated in terms of the minimum exposure time required to completely solubilize the exposed areas of the resist coating during development at a constant exposure intensity, so that those resist areas were completely removed upon subsequent development.

TABLE I

Photospeed of Resist Compositions Comprising a Novolak and Sensitizer as Unreacted Components

| Ratio of Cresols used to produce novolak | Sensitizers | | |
|---|---|---|---|
| | 2,3,4 trihydroxy-benzophenone/naphthoquinone-(1,2)-diazide-5-sulfonyl chloride[3] ester I (20% by weight) | 2,3,4 trihydroxy-benzophenone/naphthoquinone-(1,2)-diazide-5-[4] sulfonyl choloride ester II (20% by weight) | glycol monoethyl ester of [naphthoquinone-(1,2)-diazide-5-sulfonyl chloride (17% by wt.) |
| 50% m-,[1] 50% p-, 0% o-. | 4 sec. | — | — |
| 60% m-,[1] 40% p-, 0% o-. | 3.4 secs. | — | — |
| 82.5% m-,[1] 13.5% p-, 4.0% o-. | 5 secs. | 3 secs. | 17 secs. |
| 45% m-,[2] 55% p-, 0% o-. | 8 secs. | — | — |
| 42.0% m-,[2] 43.5% p-, 14.5% o-. | 10 secs. | 8 secs. | 30 secs. |

[1]These novolaks come within the scope of the present invention.
[2]These novolaks do not come within the scope of the present invention.
[3]Reaction product of 2,3,4 trihydroxybenzophenone and naphthoquinone-(1,2)-diazide-5-sulfonyl chloride in a 1:2 molar ratio.
[4]Reaction product of 2,3,4 trihydroxybenzophenone and naphthoquinone-(1,2)-diazide-5-sulfonyl chloride in a 1:1 molar ratio.

TABLE II

Photospeed of Resist Compositions Comprising a Novolak Chemically Bonded to a Sensitizer

| Ratio of Cresols Used to Produce Novolak | Sensitizers | |
|---|---|---|
| | naphthoquinone-(1,2)-diazide-5-sulfonyl chloride | naphthoquinone-(1,2)-diazide-4-sulfonyl chloride |
| 60% m-,* 40% p-. | 3 secs. (13 ± 2% sensitized) | 4 secs. (12% sensitized) 5 secs. (16% sensitized) |
| 45% m-,** 55% p-. | 8 secs. (18% sensitized) 11.2 secs. (16% sensitized) | — |
| 50% m-,*** 25% p-, 25% o-. | 10 secs. (17–19% sensitized) | — |

*This novolak is within the scope of the present invention.
**This novolak is not within the scope of the present invention.
***This sensitized novolak composition, containing a novolak not within the scope of the present invention, is a commercially sold prior art product.

The data on the above tables reflects the great increase in photospeed as measured by the minimum exposure time required to completely solubilize the exposed area of the resist compositions containing novolaks of the present invention. Yet the resists of the present invention possess resolution, adhesion, and contrast qualities at least equivalent, and in some applications superior, to prior art positive photoresists.

It will thus be seen that there are provided compositions and methods which achieve the various objects of the invention and which are well adapted to meet the conditions of practical use.

As various possible embodiments might be made of the above invention, and as various changes might be made in the embodiments above set forth, it is to be understood that all matter herein described is to be interpreted as illustrative and not in a limiting sense.

What is claimed as new and desired to be protected by Letters Patent is set forth in the appended claims.

I claim:

1. A positive photoresist composition comprising an unreacted mixture including 5 to 50 percent by weight of a photosensitive naphthoquinone diazide sulfonyl ester and 50 to 95 percent by weight of a cresol-formaldehyde novolak resin produced by condensing a mixture of cresol isomers with formaldehyde in the presence of acid, said mixture of cresols consisting essentially of percentages by weight of ortho-, meta-, and paracresol whose values are within the area bounded by quadrilateral ABCD in FIG. 1, said resin having a softening point within the range of 110° to 145° C.

2. A positive photoresist composition, as set forth in claim 1, wherein the molar ratio of formaldehyde to cresols reacted to produce the novolak does not exceed 0.9:1.

3. A positive photoresist composition, as set forth in claim 1, wherein the mixture of cresols comprises 47 percent metacresol and 53 percent paracresol by weight.

4. A positive photoresist composition, as set forth in claim 1, wherein the mixture of cresols comprises 47 percent metacrosol, 40 percent paracresol and 13 percent orthocresol by weight.

5. A positive photoresist composition, as set forth in claim 1, wherein the mixture of cresols comprises 62 percent metacresol, 5 percent paracresol and 33 percent orthocresol by weight.

6. A positive photoresist composition, as set forth in claim 1, wherein the mixture of cresols comprises 95 percent metacresol and 5 percent paracresol by weight.

7. A positive photoresist composition, as set forth in claim 1, wherein the mixture of cresols comprises 50 percent metacresol and 50 percent paracresol by weight.

8. A positive photoresist composition, as set forth in claim 1, wherein the mixture of cresols comprises 70 percent metacresol, 20 percent paracresol and 10 percent orthocresol by weight.

9. A positive photoresist composition, as set forth in claim 1, wherein the mixture of cresols comprises 50 percent metacresol, 37.5 percent paracresol and 12.5 percent orthocresol by weight.

* * * * *